United States Patent
Ramaswamy et al.

(10) Patent No.: US 8,951,829 B2
(45) Date of Patent: Feb. 10, 2015

(54) RESISTIVE SWITCHING IN MEMORY CELLS

(75) Inventors: D.V. Nirmal Ramaswamy, Boisie, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 225 days.

(21) Appl. No.: 13/078,679

(22) Filed: Apr. 1, 2011

(65) Prior Publication Data

US 2012/0248396 A1  Oct. 4, 2012

(51) Int. Cl.
*H01L 27/112* (2006.01)
*H01L 45/00* (2006.01)

(52) U.S. Cl.
CPC .............. *H01L 45/146* (2013.01); *H01L 45/08* (2013.01); *H01L 45/1233* (2013.01); *H01L 45/145* (2013.01); *H01L 45/147* (2013.01); *H01L 45/1616* (2013.01); *H01L 45/1633* (2013.01); *Y10S 438/936* (2013.01)
USPC ................................ 438/87; 438/37; 438/936

(58) Field of Classification Search
CPC ........................ H01L 27/10844; H01L 27/112
USPC ............................. 438/37, 87, 936, FOR. 288
See application file for complete search history.

(56) References Cited

U.S. PATENT DOCUMENTS

| | | | |
|---|---|---|---|
| 5,989,652 A * | 11/1999 | Ameen et al. ................. | 427/534 |
| 7,521,704 B2 | 4/2009 | Lee et al. | |
| 2003/0049900 A1* | 3/2003 | Forbes et al. ................. | 438/201 |
| 2003/0207593 A1* | 11/2003 | Derderian et al. ........... | 438/778 |
| 2006/0068099 A1 | 3/2006 | Li et al. | |
| 2006/0068603 A1* | 3/2006 | Wajda .......................... | 438/785 |
| 2007/0114587 A1 | 5/2007 | Seo et al. | |
| 2008/0191295 A1 | 8/2008 | Ranjan et al. | |
| 2009/0179187 A1* | 7/2009 | Liu et al. ........................... | 257/4 |
| 2010/0301330 A1 | 12/2010 | Ho et al. | |

OTHER PUBLICATIONS

J. Joshua Yang, et al., "A Family of Electronically Reconfigurable Nanodevices", Advanced Materials, 2009, 21 p. 1-5.

* cited by examiner

*Primary Examiner* — Julio J Maldonado
*Assistant Examiner* — Mohammad Choudhry
(74) *Attorney, Agent, or Firm* — Brooks, Cameron & Huebsch, PLLC

(57) ABSTRACT

Methods, devices, and systems associated with oxide based memory can include a method of forming a resistive switching region of a memory cell. Forming a resistive switching region of a memory cell can include forming a metal oxide material on an electrode and forming a metal material on the metal oxide material, wherein the metal material formation causes a reaction that results in a graded metal oxide portion of the memory cell.

18 Claims, 2 Drawing Sheets

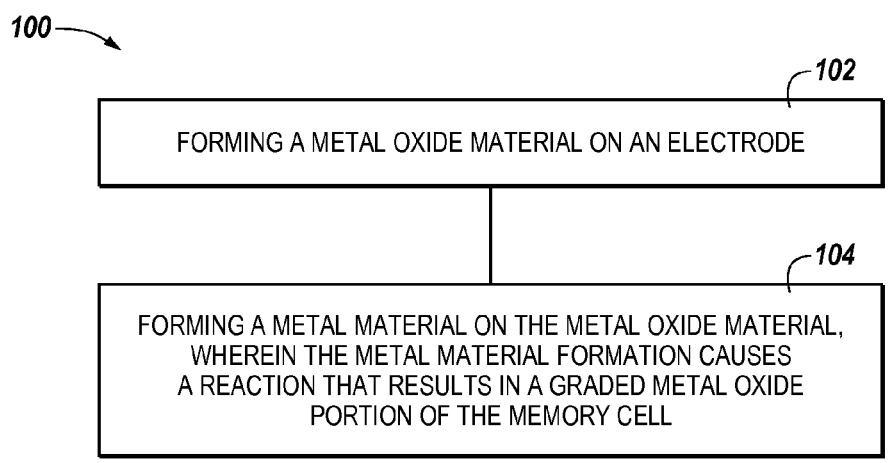
*Fig. 1*
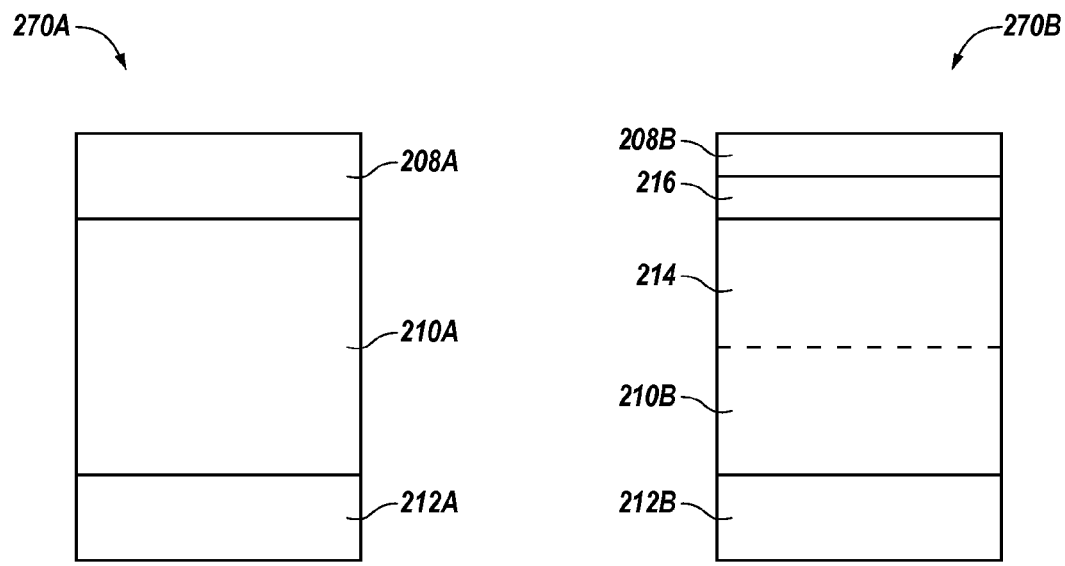
*Fig. 2A*  *Fig. 2B*

RESISTIVE SWITCHING IN MEMORY CELLS

TECHNICAL FIELD

The present disclosure relates generally to semiconductor memory devices and methods, and more particularly, to resistive switching methods in memory cells.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistive (e.g., resistance variable) memory, among others. Types of resistive memory include programmable conductor memory, phase change random access memory (PCRAM), and resistive random access memory (RRAM), among others.

Memory devices are utilized as non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices may include a number of memory cells arranged in a matrix (e.g., array). For example, an access device, such as a diode, a field effect transistor (FET), or bipolar junction transistor (BJT), for a memory cell may be coupled to an access line (e.g., word line) forming a "row" of the array. Each memory cell may be coupled to a data line (e.g., bit line) in a "column" of the array.

RRAM devices include resistive memory cells that store data based on the resistance level of a restive memory element. The cells can be programmed to a desired state (e.g., resistance level), for example, by applying sources of energy, such as positive or negative electrical pulses (e.g., current pulses) to the cells for a particular duration. Some RRAM cells can be programmed to multiple states such that they can represent (e.g., store) two or more bits of data.

The programmed state of a selected resistive memory cell may be determined (e.g., read), for example, by sensing current through the cell responsive to an applied voltage. The sensed current, which varies based on the resistance level of the memory cell, indicates the programmed state of the cell.

BRIEF DESCRIPTION OF THE DRAWINGS

FIG. 1 illustrates an example method of forming a resistive switching region of a memory cell in accordance with one or more embodiments of the present disclosure.

FIGS. 2A-2B illustrate cross-sectional views of a portion of a memory cell including a resistive switching region in accordance with one or more embodiments of the present disclosure.

DETAILED DESCRIPTION

Figure 3:
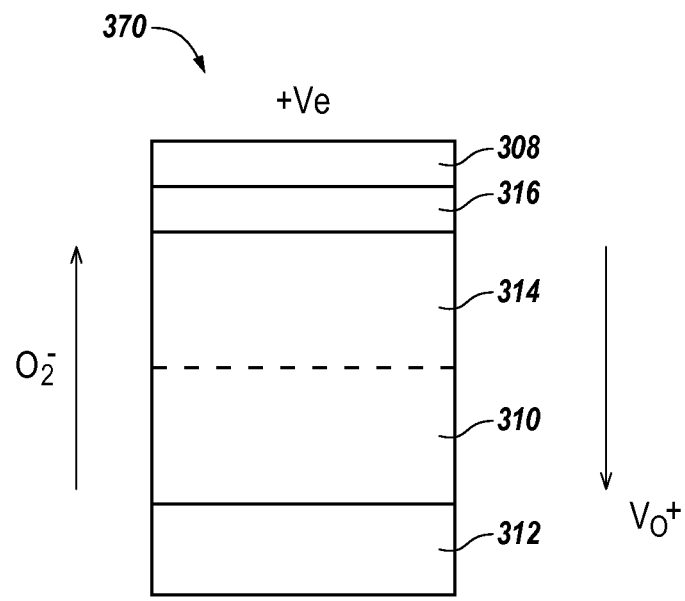
FIG. 3 illustrates a cross-sectional view of a portion of a memory cell including a resistive switching region in accordance with one or more embodiments of the present disclosure.

Methods, devices, and systems associated with resistive switching in memory cells can include a method of forming a resistive switching region of a memory cell. Forming a resistive switching region of a memory cell can include forming a metal oxide material on an electrode and forming a metal material on the metal oxide material, wherein the metal material formation causes a reaction that results in a graded metal oxide portion of the memory cell.

Embodiments of the present disclosure can provide benefits such as providing RRAM cells having improved switching characteristics as compared to previous RRAM cells, among other benefits. As described further herein, forming a metal electrode on a metal oxide via a chemical vapor deposition (CVD) process, as compared to a physical vapor deposition (PVD) process, can have various benefits such as providing increased switching characteristics as compared to a PVD electrode formed on a metal oxide material.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 212 may reference element "12" in FIG. 2, and a similar element may be referenced as 312 in FIG. 3. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 illustrates an example method 100 of forming a resistive switching region of a memory cell in accordance with one or more embodiments of the present disclosure. At 102, a metal oxide material is formed on a first electrode of a memory cell. The memory cell can be an oxide based RRAM cell, for example. An oxide based memory cell can refer to a cell that includes an oxide material (e.g., an oxygen source) between two conductive elements (e.g., electrodes). Some oxide based memory cells can include one or more additional oxide materials and/or metal materials along with the oxide material(s) between the two conductive elements.

Examples of metal oxides that can be included in the metal oxide material include an aluminum oxide, a tin dioxide, zinc peroxide, a hafnium silicon oxide, a zirconium oxide, a lanthanum oxide, a titanium oxide, and a hafnium oxide, among other metal oxide materials. The metal oxide material formed on the first electrode can also include titanium dioxide, which is an oxygen getter. An oxygen getter can refer to a material with an affinity for oxygen. The metal oxide material can be formed (e.g., deposited) via an atomic layer deposition (ALD) process. However, embodiments are not limited to a particular deposition process.

At 104, a metal material is formed on the metal oxide material. As described further below, in various embodiments, formation of the metal material includes a reaction that results in a graded metal oxide portion of the memory cell. The metal material can serve as a second electrode and can be, for example, titanium, nickel, strontium, hafnium, zirconium, tantalum, and/or tungsten, among other metals. The metal material can be formed via a CVD process. As described further herein, forming the metal electrode on the metal oxide via a CVD process, as compared to a PVD process, can have various benefits such as providing increased switching characteristics as compared to a PVD electrode formed on the metal oxide material. The metal material can also be formed via an atomic layer deposition (ALD) process.

For instance, additional materials (e.g., materials other than the metal) such as additional materials associated with the metal precursor source (e.g., chlorine), as well as other precursor materials and/or reactants (e.g., hydrogen, argon, etc.) associated with an in situ CVD process can contribute to the reaction that results in formation of a graded metal oxide portion of a memory cell, in accordance with one or more embodiments described herein. Some examples of precursor materials include, but are not limited to, hydrogen, argon (e.g., argon plasma), and/or a titanium chloride material such as titanium tetrachloride, titanium trichloride, or titanium dichloride, for example.

The metal formation on the metal oxide causes a reaction in the chamber that results in a graded metal oxide portion of the memory cell. This graded metal oxide portion can include a resistive, substoichiometric graded metal oxide. A substoichiometric oxide can be an oxide that has an oxygen percentage below a stoichiometric ratio for the oxide. A near-stoichiometric oxide can be an oxide that has an oxygen percentage at or approximately at a stoichiometric ratio for the oxide.

Figure 4:
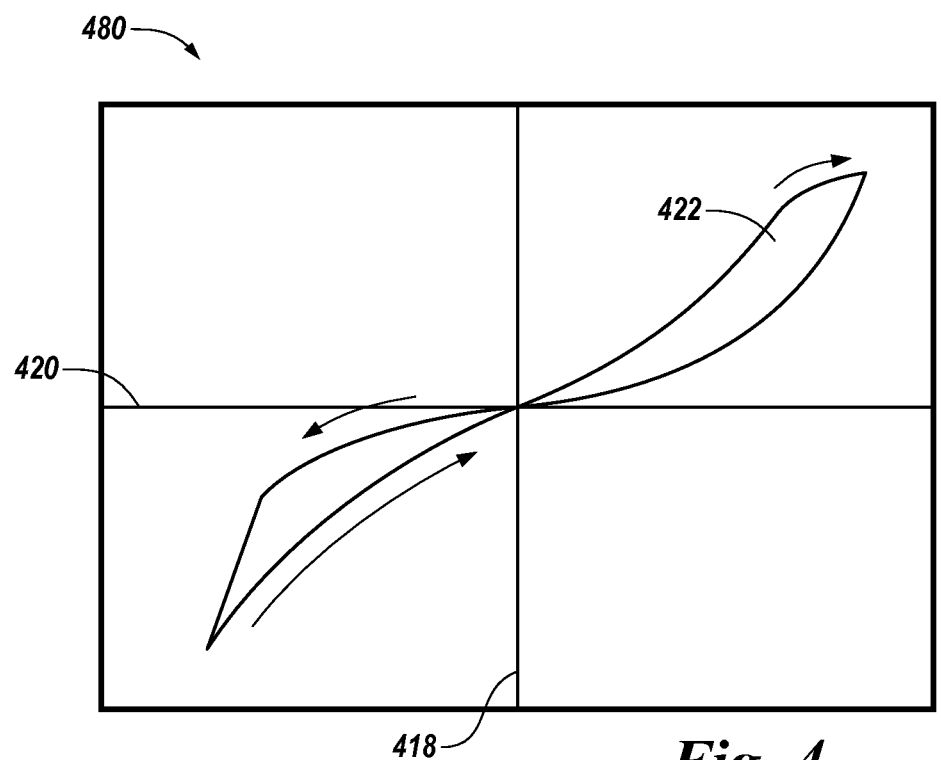
FIG. 4 illustrates a current density versus voltage diagram associated with a memory cell formed in accordance with one or more embodiments of the present disclosure.

Formation of the graded metal oxide portion of the memory cell results in a region having resistive random access memory switching characteristics, such as shown in FIG. 4. Resistive random access memory (RRAM) switch region characteristics can include the graded metal oxide portion being made to conduct through a path formed after application of a sufficiently high voltage. The path can be reset (e.g., resulting in high resistance) or set (e.g., resulting in lower resistance) by an appropriately applied voltage. The switching region of an RRAM memory cell exhibits reversible resistive switching (e.g., from high to low resistance or vice versa) responsive to particular applied voltage pulses, for instance.

The resistive switching characteristics can vary depending on factors such as the particular metal oxide material involved, among other factors. As an example, in unipolar resistive switching, a memory cell in a highly resistive state can be put into a low-resistance state by applying a high voltage stress (e.g., forming process). A memory cell can be switched to a high resistance state by applying a threshold voltage (e.g., reset process). Switching from a high resistance state to a low resistance state (e.g., set process) can be achieved by applying a threshold voltage that is larger than the reset voltage. In contrast, bipolar resistive switching can show directional resistive switching depending on the polarity of the applied voltage.

FIGS. 2A-2B illustrate cross-sectional views of a portion of a memory cell including a resistive switching region in accordance with one or more embodiments of the present disclosure. FIG. 2A illustrates a metal oxide material 210A formed on a first electrode 212A of the memory cell 270A. A metal material 208A is formed on the metal oxide material 210A opposite first electrode 212A and can serve as a second electrode of the memory cell 270A. Although not shown in FIGS. 2A and 2B, the first and second electrodes (e.g., 212A and 208A) can be coupled to a respective word line and bit line of the memory array. The electrodes can have the same or different physical sizes and/or shapes (e.g., the memory cell can be symmetric or asymmetric). An example of a material used as second electrode material 208A includes titanium, although embodiments are not limited to particular electrode materials or combinations thereof. First electrode 212A can be non-reactive with respect to metal oxide material 210A. Example materials used in first electrode 212A include platinum and rhodium, although embodiments are not limited to particular electrode materials or combinations thereof.

The metal oxide material 210A can include, for example, titanium dioxide, perovskite metal oxide (PCMO), lanthanum calcium manganese oxide (LCMO), strontium titanate (STO), and/or magnesium oxide (MgO), among other suitable oxygen sources. Formation of the metal oxide material 210A can occur via ALD or other suitable deposition process. In some embodiments, the metal oxide material 210A can have a thickness of approximately 30 to 1000 angstroms. However, embodiments are not limited to a particular thickness of metal oxide material 210A.

The metal material 208A can be reactive with respect to the metal oxide material 210A. In some embodiments, the metal material 208A can be formed of a same material as at least one or more materials of the metal oxide material 210A. Some examples of metal materials 208A that can be formed on the metal oxide material 210A include titanium, tantalum, aluminum, hafnium, zirconium, among other metals and/or combinations thereof. The metal material 208A can be formed in situ using a CVD process. In one or more embodiments, the CVD process is performed at a temperature of at least 400 degrees Celsius. The metal precursor source material (e.g., titanium chloride) as well as other precursor materials and/or reactants (e.g., hydrogen, argon, etc.) associated with the in situ CVD process can react with the previously formed metal oxide material 210A (e.g., titanium oxide) resulting in formation of a graded metal oxide portion 214 of a memory cell, as described in connection with FIG. 2B.

FIG. 2B illustrates a portion of the oxide based memory cell 270A at a subsequent process stage (e.g., subsequent to deposition of the metal material 208A via a CVD process). The formation of the metal material 208A onto the metal oxide material 210A, as illustrated in FIG. 2A, results in a reaction that can create a second metal oxide material 216 (e.g., a "reacted" metal oxide) at the interface between the metal 208A and the deposited metal oxide material 210A. The reacted metal oxide 216 can include materials such as aluminum oxide ($AlO_x$), silicon dioxide ($SiO_2$), silicon oxynitride (SiON), hafnium silicon oxide ($HfSiO_x$), zirconium silicon oxide ($ZrSiO_x$), zirconium silicon oxynitride (ZrSiON), hafnium oxide ($HfO_x$), zirconium oxide ($ZrO_x$), titanium oxide ($TiO_2$), hafnium zirconium oxide ($HfZrO_x$), hafnium titanium oxide ($HfTiO_x$), zirconium titanium oxide ($ZrTiO_x$), and/or strontium oxide (SrO), among other materials.

Formation of the reacted metal oxide 216 at the interface can create the graded metal oxide portion 214. The graded metal oxide portion 214 of the memory cell 270B can include a resistive substoichiometric graded metal oxide material. The resistivity of the graded metal oxide portion 214 of the memory cell 270B can be dependent on the location of oxygen ions in the graded portion 214 and can change as the location of the oxygen ions change, either in the metal oxide portion 210B or the reacted metal oxide portion 216. The state of the memory cell 270B can change depending on the location of the oxygen ions, and the state of the cell can be read by applying a read voltage across the memory cell 270B (e.g., via the first electrode 212B and the second electrode 208B).

In an example in which the metal oxide material 210A is titanium dioxide ($TiO_2$) and the metal material 208A is titanium, a plasma enhanced CVD (PECVD) process can be used to form the graded metal oxide portion 214 and can include a titanium tetrachloride ($TiCl_4$) metal precursor source along with hydrogen ($H_2$) and an argon plasma component. In this example, the graded metal oxide portion 214 can be a substoichiometric titanium oxide ($TiO_{2-x}$). In the example illustrated in FIG. 2B, region 210B represents a stoichiometric metal oxide material; however, embodiments are not so limited. For instance, in one or more embodiments, the region 210B may also be substoichiometric due to formation of the metal 208B on the underlying metal oxide.

FIG. 3 illustrates a cross-sectional view of a portion of a memory cell including a resistive switching region in accordance with one or more embodiments of the present disclosure. In this example, oxygen vacancy movement (e.g., "Vo+") responsive to an applied voltage (e.g., "+Ve") is illustrated. The movement of the oxygen vacancies can indicate the occurrence of resistive switching in the memory cell 370. The metal oxide material 310 of memory cell 370 can be an oxide including oxygen vacancies ("Vo"). When an electric field is applied, the oxygen vacancies drift, changing a boundary between a high-resistance portion of a memory cell (e.g., memory cell 370) and a low-resistance portion of a memory cell (e.g., memory cell 370). The resistance of the graded oxide portion 314 as a whole is dependent on how much charge has been passed through it in a particular direction, which is reversible by changing the direction of the current through the cell.

A migration of oxygen vacancies in the vicinity of a memory cell interface may drive resistive switching. In resistive switching, a change in resistance (e.g., greater than five percent) can occur due to application of pulsed voltages, and the resistance of a memory cell (e.g., memory cell 370) can be set to a desired value by applying an appropriate voltage pulse. Resistance switching can take place at an interface of a memory cell (e.g., memory cell 370). For example, a switching can take place between a metal electrode and an oxide. As illustrated in FIG. 3, the switching characteristics of memory cell 370 and graded portion 314 are consistent with ions (e.g., $O_2$—) moving towards an interface of the memory cell 370 for a resistive portion (e.g., graded portion 314) near an electrode (e.g., metal material 308 acting as a second electrode). Memory cell 370 can further include a first electrode 312, a metal oxide material 310, and a reacted metal oxide portion 316.

FIG. 4 illustrates a current density versus voltage diagram associated with a memory cell formed in accordance with one or more embodiments of the present disclosure. Diagram 480 represents one example of a current density (e.g., axis 418) versus voltage (e.g., axis 420) switching curve 422 that can be associated with one or more memory cells described herein (e.g., memory cell 270B shown in FIG. 2B or memory cell 370 shown in FIG. 3). The switching curve shows behavior indicative of resistive switching at a graded portion of a memory cell (e.g., graded portion 214 shown in FIG. 2B or graded portion 314 shown in FIG. 3). For example, the curve 422 shows rectification behavior and hysteretic behavior. Rectification behavior can include current measurements that are higher for one voltage polarity than for the same voltage with opposite polarity, producing an asymmetric current-voltage (I-V) curve (e.g., curve 422). Hysteresis can refer to systems that can exhibit path dependence. If a system with hysteresis is plotted on a graph, the resulting curve can be in the form of a loop (e.g., curve 422). In contrast, a curve for a system without hysteresis may be a single, not necessarily straight, line. A diagram representing an interface showing no resistive switching may be represented by an ohmic curve (e.g., metal-insulator-metal I-V curve).

Methods, devices, and systems associated with resistive switching in memory cells can include a method of forming a resistive switching region of a memory cell. Forming a resistive switching region of a memory cell can include forming a metal oxide material on an electrode and forming a metal material on the metal oxide material, wherein the metal material formation causes a reaction that results in a graded metal oxide portion of the memory cell.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a resistive switching region of a memory cell, comprising:
   forming a metal oxide material on an electrode; and
   forming a metal material on the metal oxide material, wherein the formation causes a reaction with the metal oxide material, wherein the reaction results in both a graded metal oxide portion of the memory cell and a reacted metal oxide portion of the memory cell at an interface between the metal oxide material and the metal material.

2. The method of claim 1, wherein forming the metal oxide material includes forming a titanium dioxide material.

3. The method of claim 1, including forming the metal oxide material using an atomic layer deposition process.

4. The method of claim 1, wherein forming the metal material includes forming a titanium material.

5. The method of claim 1, including forming the metal material using a plasma enhanced chemical vapor deposition process.

6. The method of claim 1, wherein the graded metal oxide portion includes a resistive, substoichiometric graded metal oxide material.

7. The method of claim 1, wherein forming the metal material on the metal oxide material includes providing titanium chloride, hydrogen, and argon plasma in a chamber.

8. The method of claim 1, wherein the graded metal oxide portion has the characteristics of a resistive random access memory switch region.

9. A method of forming a resistive switching region of a memory cell comprising:
    forming a metal oxide material using an atomic layer deposition process;
    forming a metal material on the metal oxide material using a plasma enhanced chemical vapor deposition process, wherein the formation causes a reaction with the metal oxide material, wherein the reaction results in both a graded metal oxide portion of the memory cell and a reacted metal oxide portion of the memory cell at an interface between the metal oxide material and the metal material.

10. The method of claim 9, wherein using the plasma enhanced chemical vapor deposition process includes introducing titanium chloride, hydrogen, and argon plasma into a chamber at a temperature of at least 400 degrees Celsius.

11. The method of claim 9, wherein forming the metal oxide material includes forming a titanium dioxide material and forming the metal material includes forming a titanium material.

12. The method of claim 9, wherein the graded metal oxide portion includes a resistive, substoichiometric graded titanium dioxide material.

13. A method of forming a memory cell structure, comprising:
    forming a metal oxide material on a first electrode; and
    forming a metal material on the metal oxide material, wherein at least a portion of the metal material reacts with the metal oxide material to form both a graded metal oxide portion of the memory cell and a reacted metal oxide portion of the memory cell at an interface between the metal oxide material and the metal material.

14. The method of claim 13, wherein forming the graded metal oxide portion includes forming a resistive switching portion of the memory cell.

15. The method of claim 13, wherein the metal material serves as a second electrode of the memory cell.

16. The method of claim 13, wherein forming the metal oxide material includes forming a titanium oxide material using an atomic layer deposition process.

17. The method of claim 13, wherein forming the metal material on the metal oxide material includes forming a titanium material using a plasma enhanced chemical vapor deposition process.

18. The method of claim 17, wherein forming the metal material on the metal oxide material using the plasma enhanced chemical vapor deposition process includes using titanium chloride and at least one of hydrogen and argon.

* * * * *

UNITED STATES PATENT AND TRADEMARK OFFICE
CERTIFICATE OF CORRECTION

PATENT NO.         : 8,951,829 B2                              Page 1 of 1
APPLICATION NO.    : 13/078679
DATED              : February 10, 2015
INVENTOR(S)        : D. V. Nirmal Ramaswamy et al.

It is certified that error appears in the above-identified patent and that said Letters Patent is hereby corrected as shown below:

On the title page item (75), in column 1, in "Inventors", line 1, delete "Boisie," and insert
-- Boise, --, therefor.

Signed and Sealed this
Fifth Day of May, 2015

Michelle K. Lee
*Director of the United States Patent and Trademark Office*